(12) United States Patent
Ueno et al.

(10) Patent No.: US 8,810,235 B2
(45) Date of Patent: Aug. 19, 2014

(54) CURRENT SENSOR AND METHOD FOR MANUFACTURING SENSOR MODULE FOR USE IN CURRENT SENSOR

(75) Inventors: Hiroshi Ueno, Aichi (JP); Yuji Inagaki, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 412 days.

(21) Appl. No.: 12/869,313

(22) Filed: Aug. 26, 2010

(65) Prior Publication Data

US 2011/0050222 A1 Mar. 3, 2011

(30) Foreign Application Priority Data

Sep. 1, 2009 (JP) .................................. 2009-201717

(51) Int. Cl.
*G01R 33/07* (2006.01)
*G01R 15/20* (2006.01)

(52) U.S. Cl.
CPC ............ *G01R 15/207* (2013.01); *G01R 15/202* (2013.01)
USPC ....................................... 324/117 H; 324/253

(58) Field of Classification Search
USPC .............................................. 324/117 H, 253
See application file for complete search history.

(56) References Cited

U.S. PATENT DOCUMENTS

| | | | |
|---|---|---|---|
| 5,523,677 A | 6/1996 | Kawakami et al. | |
| 7,501,808 B2 * | 3/2009 | Ishihara et al. | 324/117 R |
| 7,679,357 B2 | 3/2010 | Aratani et al. | |
| 2008/0030190 A1 | 2/2008 | Ishihara et al. | |
| 2008/0048642 A1 | 2/2008 | Aratani et al. | |

FOREIGN PATENT DOCUMENTS

| | | |
|---|---|---|
| CN | 1109974 | 10/1995 |
| JP | 4-131776 | 12/1992 |
| JP | 2002-303642 A | 10/2002 |
| JP | 2003-043074 A | 2/2003 |
| JP | 2004-257953 | 9/2004 |
| JP | 2007-171156 A | 7/2007 |
| JP | 2008-051704 A | 3/2008 |

OTHER PUBLICATIONS

English translation of 2009-201717, Japanese office action dated Nov. 25, 2012, 2 pages.*
Office Action for corresponding CN application No. 201010269190.9 dated Nov. 15, 2012; 6 pages.
Japanese Office Action dated Nov. 25, 2012. No English translation. 2009-201717.

* cited by examiner

*Primary Examiner* — Reena Aurora
(74) *Attorney, Agent, or Firm* — Patterson Thuente Pedersen, P.A.

(57) ABSTRACT

A current sensor for outputting a detection signal corresponding to a current flowing through a bus bar. The current sensor includes a magnetic core that concentrates and amplifies magnetic flux generated by the current near a detection portion of the bus bar. A magnetic detection element detects the magnetic flux concentrated by the magnetic core and outputs an electrical signal corresponding to the detected magnetic flux. A signal processing circuit includes electronic components and processes the electrical signal output from the magnetic detection element to generate the detection signal. A lead frame holds the magnetic detection element and the electronic components. The magnetic detection element, electronic components, and lead frame are combined to form a single sensor module. The current sensor detects the current flowing through the bus bar with the sensor module and outputs the detection signal.

16 Claims, 10 Drawing Sheets

US 8,810,235 B2

CURRENT SENSOR AND METHOD FOR MANUFACTURING SENSOR MODULE FOR USE IN CURRENT SENSOR

CROSS-REFERENCE TO RELATED APPLICATIONS

This application is based upon and claims the benefit of priority from prior Japanese Patent Application No. 2009-201717, filed on Sep. 1, 2009, the entire contents of which are incorporated herein by reference.

BACKGROUND OF THE INVENTION

The present invention relates to a current sensor for detecting the magnitude of current flowing through a conductor.

A known current sensor uses magnetic detection elements such as Hall elements or magnetoresistance effect elements. The current detection performed by a current sensor that uses Hall elements will now be described.

When current flows through a current path such as a wire, the current forms a magnetic field near the current path. The strength of the magnetic field is proportional to the magnitude of the current. When a Hall element is arranged in the magnetic field formed near the current path, the Hall element generates a Hall voltage that is proportional to the current flowing through the current path. A current sensor that uses the Hall element detects the current flowing through the current path based on the Hall voltage.

However, when the strength of the magnetic field acting on the Hall element is small, the proportional relationship of the magnetic field strength and the Hall voltage becomes difficult to maintain. Further, the strength of the magnetic field generated by the current flowing through the current path is low in the first place. To increase the current detection sensitivity of the current sensor, Japanese Laid-Open Patent Publication No. 2002-303642 describes a magnetic core that concentrates the magnetic flux generated by the current flowing through a current path and amplifies the magnetic flux acting on the Hall element. A prior art current sensor including a magnetic core will now be described with reference to FIG. 13.

The current sensor of FIG. 13 is coupled to a bus bar 110. The bus bar 110 is a conductor for supplying power and connected to, for example, a vehicle battery. The current sensor includes a magnetic core 101, a printed circuit board 103, and a case 104. The magnetic core 101 concentrates the magnetic flux generated by the current flowing through the bus bar 110. A Hall element 102 and electronic components are mounted on the printed circuit board 103. The case 104 accommodates the magnetic core 101 and the printed circuit board 103. The case 104 includes a sleeve 104a through which the bus bar 110 is inserted. The magnetic core 101 is C-shaped and includes a clearance CS (gap). The sleeve 104a is inserted into the middle of the space formed at the inner side of the magnetic core 101 so that the magnetic core 101 surrounds the sleeve 104a and the bus bar 110. The clearance CS (gap) of the magnetic core 101 allows for insertion of the Hall element 102. The printed circuit board 103 is connected to a male terminal connector 105, which is arranged on an outer wall of the case 104. The magnetic core 101 concentrates and amplifies the magnetic flux generated by the current flowing through the bus bar 110. Leakage flux generated in the clearance CS acts on the Hall element 102. The magnetic flux acting on the Hall element 102 is amplified. This allows for the current sensor to detect the magnitude of a small current flowing through the bus bar 110. A detection signal corresponding to the Hall voltage of the Hall element 102 is provided to an in-vehicle device (not shown) via the conductor of the printed circuit board 103 and the male terminal connector 105.

SUMMARY OF THE INVENTION

The current sensor of the prior art requires the relatively large printed circuit board 103, the area of which must be sufficient for the mounting of the Hall element 102 and the electronic components. The relatively large printed circuit board 103 occupies space in the case 104 and imposes great restrictions on the degree of design freedom for the current sensor.

The present invention provides a current sensor having a high degree of design freedom.

One aspect of the present invention is a current sensor for outputting a detection signal corresponding to a current flowing through a bus bar. The current sensor includes a magnetic core that concentrates and amplifies magnetic flux generated by the current near a detection portion of the bus bar. A magnetic detection element detects the magnetic flux concentrated by the magnetic core and outputs an electrical signal corresponding to the detected magnetic flux. A signal processing circuit includes electronic components and processes the electrical signal output from the magnetic detection element to generate the detection signal. The magnetic detection element and the electronic components are mounted on a lead frame. The magnetic detection element, the electronic components, and the lead frame are combined to form a single sensor module. The current sensor detects the current flowing through the bus bar with the sensor module and outputs the detection signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A current sensor according to a first embodiment of the present invention will now be discussed with reference to FIGS. 1 to 6. First, the structure of the current sensor will be described with reference to FIGS. 1 to 3.

Figure 1:
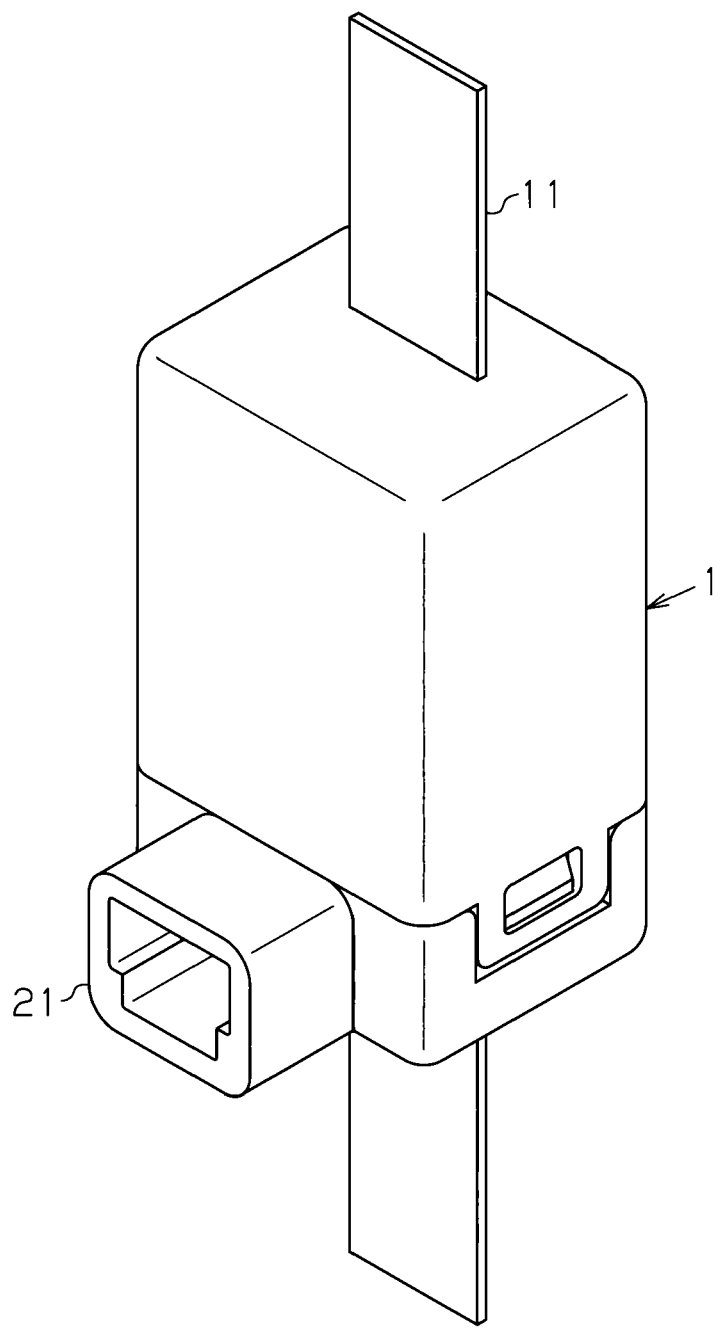
FIG. 1 is a perspective view showing a current sensor according to a first embodiment of the present invention.

As shown in FIG. 1, a case 1 covers electronic components of the current sensor. The case 1 protects the electronic components from the ambient environment. A connector 21 is arranged on the front of the case 1. The connector 21 is connected to a harness or the like (not shown) and may be used to supply the current sensor with power and output a detection signal of the current sensor to an external device. A long planar bus bar 11 is attached to the case 1 in a state extending vertically through the case 1 as viewed in the drawing. The bus bar 11 is a conductor and connected to, for example, a vehicle battery to supply an in-vehicle device with power.

Figure 2:
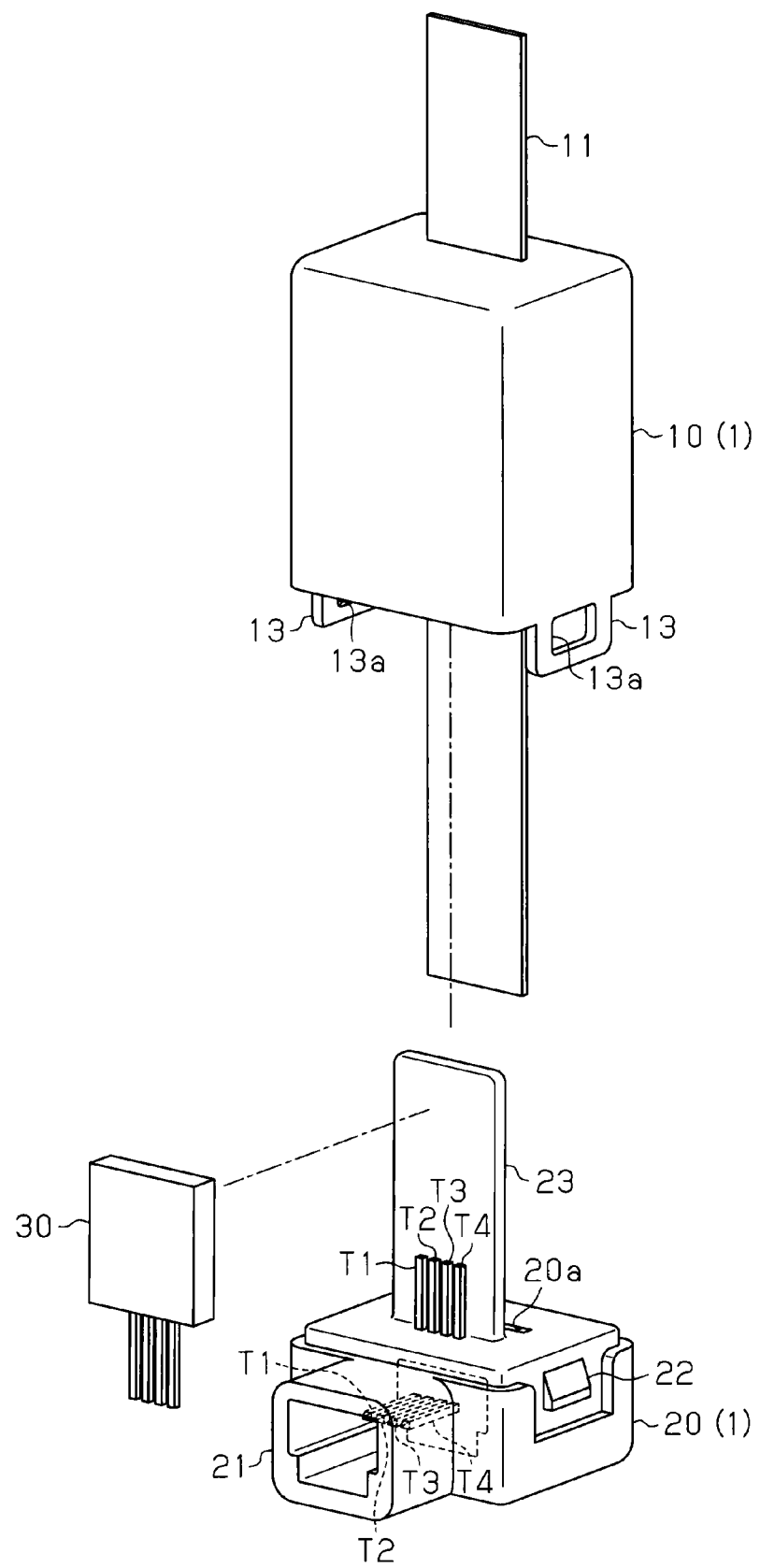
FIG. 2 is a perspective exploded view showing the current sensor of FIG. 1.

As shown in FIG. 2, the case 1 includes an upper case 10 and a lower case 20. The bus bar 11 is attached to the upper case 10. A tab 13 having a through hole 13a extends from the bottom of each of two opposing side walls of the upper case 10. The connector 21 is arranged on the lower case 20. A hook 22 is arranged on each of two opposing side walls of the lower case 20 to engage with the corresponding tab 13 of the upper case 10. The upper case 10 may be referred to as a first member, and the lower case 20 may be referred to as a second member. The case 1 is separable into the first and second members 10 and 20, or first and second segments. This increases the design freedom for the case 1 and convenience for assembling the current sensor. The cases 10 and 20 are formed from a resin material. The engagement of the tabs 13 and the hooks 22 integrally couples the upper case 10 and the lower case 20 and forms the case 1. The tabs 13 and hooks 22 may be referred to as a coupling structure. The tabs 13 may be formed on the second member 20, and the hooks 22 may be formed on the first member 10.

Figure 3:
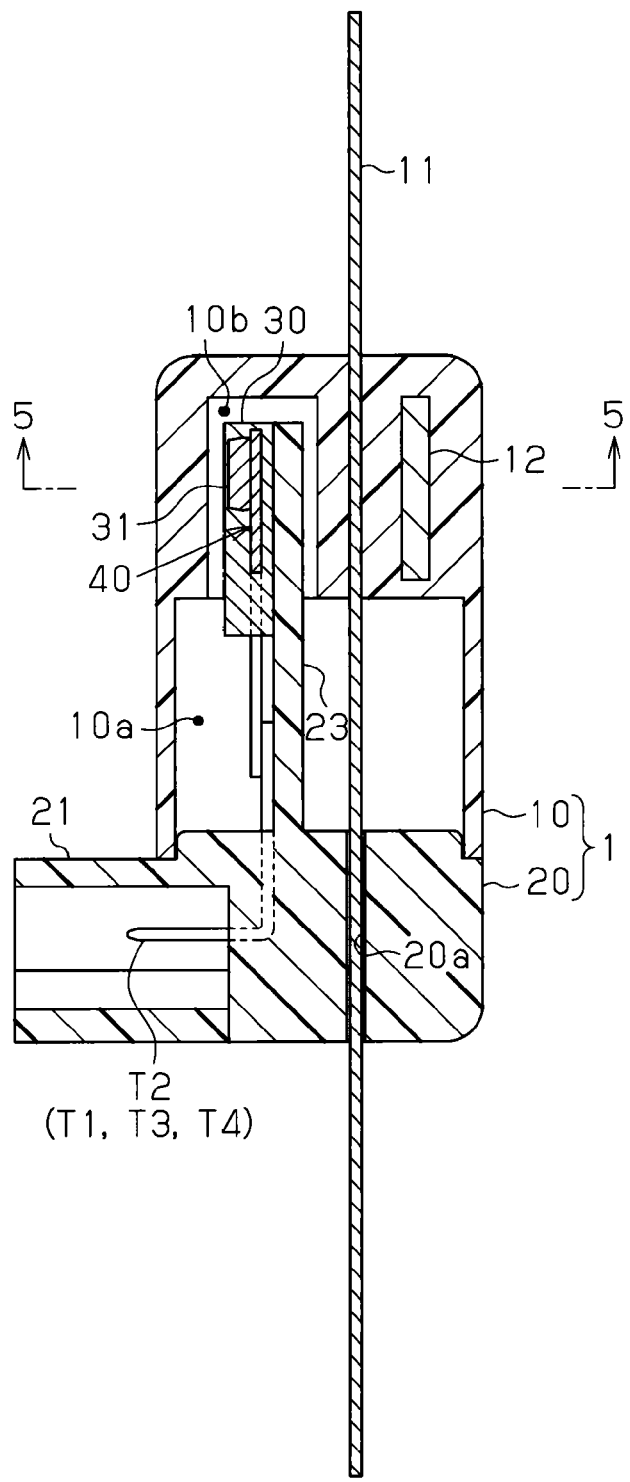
FIG. 3 is a cross-sectional view showing the current sensor of FIG. 1.

A planar tongue 23 projects from the upper surface of the lower case 20. A sensor module 30 is mounted on the tongue 23. In the example of FIG. 3, the tongue 23 supports the sensor module 30 substantially parallel to the bus bar 11.

Figure 4:
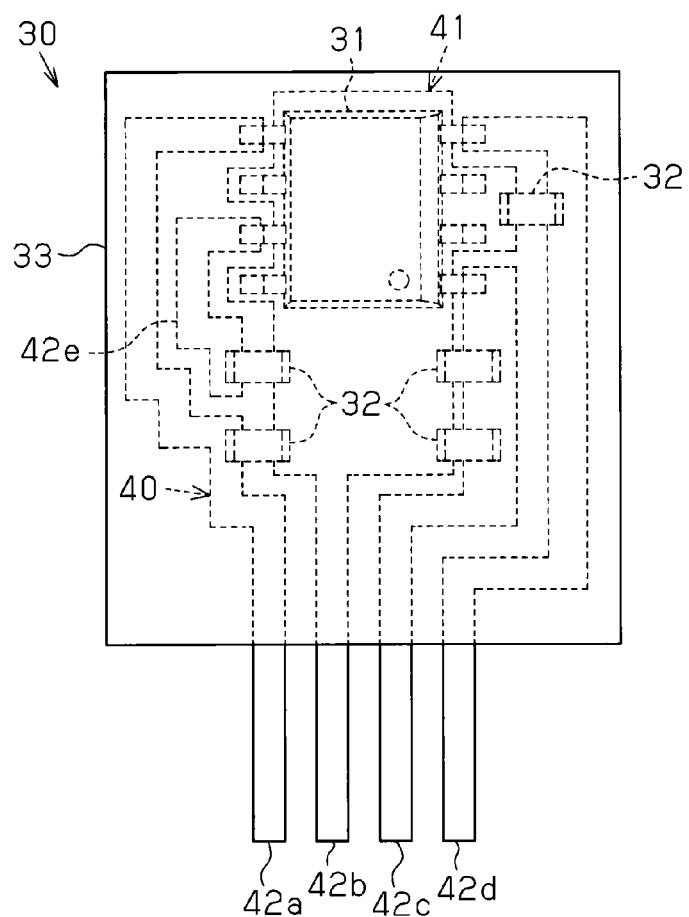
FIG. 4 is a front view showing a sensor module in the current sensor of FIG. 1.

Referring to FIG. 4, the sensor module 30 basically includes a Hall IC 31, electronic components 32 such as resistors and capacitors, and a lead frame 40 onto which the Hall IC 31 and electronic components 32 are mounted. A Hall element serving as a magnetic detection element (magneto-electric conversion element) and its peripheral circuits are integrally integrated in the Hall IC 31.

The lead frame 40 is a conductive component or metal component including a plurality of leads 42a to 42e. A resin mold 33 seals the Hall IC 31, the electronic components 32, and part or all of each of the leads 42a to 42e. The lead 42b has a planar basal portion defining an element mounting portion 41. The Hall IC 31 is mounted on the element mounting portion 41. The Hall IC 31 has terminals coupled to basal portions of the leads 42a to 42e. This electrically connects the Hall IC 31 to the lead frame 40. The electronic components 32 and the leads 42a to 42e form a signal processing circuit for processing voltage signals output from the Hall IC 31.

The leads 42a to 42d each have a distal portion extending from a bottom surface of the resin mold 33. The distal portions of the leads 42a to 42c function as a power supply terminal and an output terminal of the sensor module 30. The sensor module 30 is manufactured by mounting the Hall IC 31 and the electronic components 32 on the lead frame 40 and then sealing the lead frame 40, the Hall IC 31, and the electronic components 32 with a resin material. Molding, such as insert molding, may be performed for the sealing with resin material. The resin material is the material forming the resin mold 33 and may be, for example, thermoset resin. In this manner, the Hall IC 31, the electronic components 32, and the leads 42a to 42e are combined and integrated through resin molding in the single sensor module 30. This increases the coupling reliability of the Hall IC 31, the electronic components 32, and the lead frame 40 as compared to a prior art current sensor that solders a Hall element and electronic components to a printed circuit board.

The tongue 23 has a front portion from which basal portions of metal pins T1 to T4 extend, as viewed in FIG. 2. The power supply and output terminals of the sensor module 30 are coupled to the basal portions of the metal pins T1 to T4 through, for example, resistance joining. Distal portions of the metal pins T1 to T4 extend into the connector 21 and function as power supply and output terminals of the current sensor. Referring to FIG. 3, the metal pins T1 to T4 are molded (embedded) and integrated in the lower case 20 when resin molding the lower case 20. An insertion hole 20a extends through the lower case 20 at the rear of the tongue 23. The bus bar 11 is inserted through the insertion hole 20a.

As shown in FIG. 3, the upper case 10 is capable of accommodating the tongue 23, the sensor module 30, and the like. The upper case 10 includes a large accommodation compartment 10a, which accommodates a lower portion of the tongue 23, and a small accommodation compartment 10b, which accommodates an upper portion of the tongue 23 and the sensor module 30. The upper case 10 has a wall in which a detection portion of the bus bar 11 and a magnetic core 12 are integrally molded (embedded) at a location facing toward the small accommodation compartment 10b. In this manner, the detection portion of the bus bar 11 and the magnetic core 12 are integrated in the upper case 10. This increases the positioning accuracy of the bus bar 11 relative to the magnetic core 12.

Figure 5:
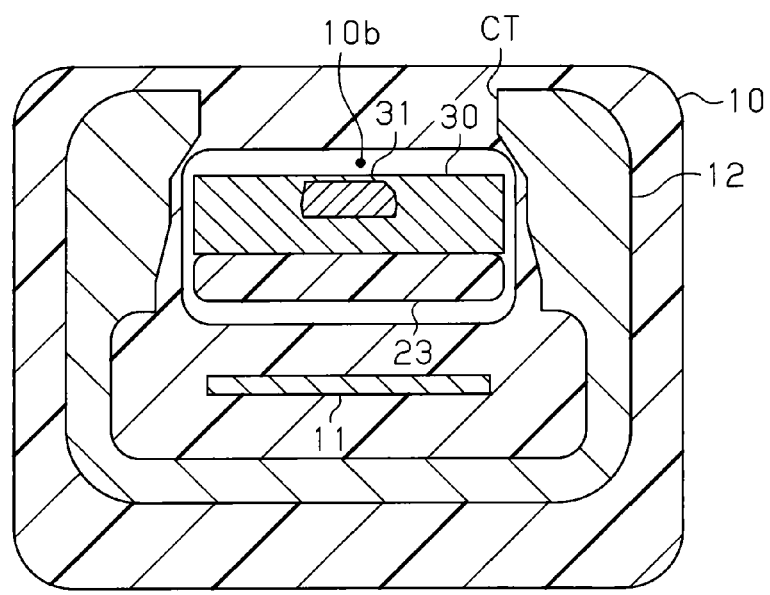
FIG. 5 is a cross-sectional view taken along line 5-5 in FIG. 3.

With reference to FIG. 5, the structure of the magnetic core 12 will now be described in detail. FIG. 5 does not show the electronic components 32 and the lead frame 40.

As shown in FIG. 5, the magnetic core 12 is a C-shaped member that surrounds the detection portion of the bus bar 11. The C-shaped member includes a clearance CT corresponding to the small accommodation compartment CT. The magnetic core 12 has two opposing ends that define the clearance CT in between. The opposing ends of the magnetic core 12 are thicker than the other parts of the magnetic core 12. Each opposing end includes a stepped surface. The stepped surface is formed so that the clearance CT narrows from the inner side of the magnetic core 12 toward the outer side of the magnetic core 12. In the magnetic core 101 of the prior art current sensor, the clearance CS has a constant width. The magnetic flux generated in the clearance CS of the constant width becomes smaller as the outer side of the magnetic core becomes closer. Further, the magnetic flux generated in the clearance CS becomes larger as the width of the clearance CS becomes smaller. In the first embodiment, the clearance CT narrows from the inner side of the magnetic core 12 toward the outer side of the magnetic core 12. Thus, the magnetic flux is evenly generated in the clearance CT. The sensor module 30 accommodated in the small accommodation compartment 10b is located in the central part of the clearance CT. When the upper case 10 and the lower case 20 are coupled to each other, the magnetic core 12 and the Hall IC 31 of the sensor module 30 form a magnetic circuit that surrounds the detection portion of the bus bar 11.

Due to such a structure, the magnetic core 12 concentrates and amplifies the magnetic flux generated by the current flowing through the bus bar 11 in the current sensor. The leakage flux in the clearance CT acts on the Hall IC 31 of the sensor module 30. In this state, the Hall IC 31 outputs a voltage signal in correspondence with the current flowing through the bus bar 11. The detection signal is output to an external device via the connector 21.

Figure 6:
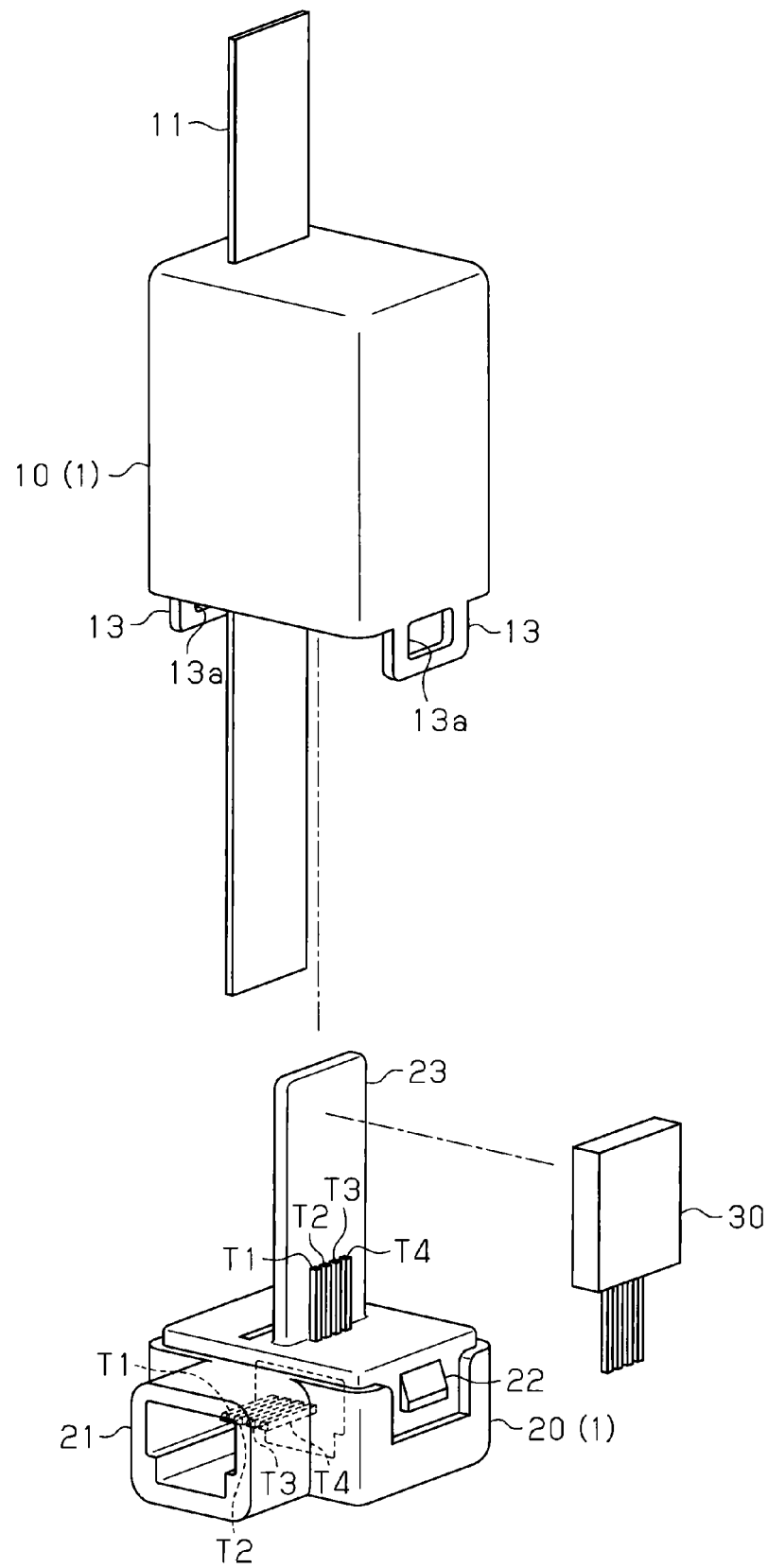
FIG. 6 is an exploded perspective view showing a first modification of the current sensor.

The current sensor of the first embodiment does not use a printed circuit board for the mounting of the Hall element (Hall IC 31). This accordingly reduces design correction work for changing the location and direction of the Hal element (Hall IC 31). More specifically, when changing the direction of the Hall element by "90°", the direction of the printed circuit board would have to be changed together with the Hall element. This results in drastic design changes of the current sensor. In contrast, with the first embodiment, the direction of the Hall element (Hall IC 31) may easily be changed by "90°" just by changing, for example, the direction of the sensor module 30 by "90°" as shown in FIG. 6. In this manner, the current sensor of the first embodiment has a higher degree of design freedom in comparison with the current sensor of the prior art. When changing the direction of the sensor module 30 by "90°", the shape of the tongue 23, the layout of the metal pins T1 to T4, the shape of the magnetic core 12, and the location of the bus bar 11 are changed as required.

The elimination of the printed circuit board from the current sensor of the first embodiment allows for size reduction and lower manufacturing costs.

The current sensor of the first embodiment has the advantages described below.

(1) The Hall IC 31, the electronic components 32, and the lead frame 40 are combined to form the single sensor module 30. The current sensor detects the current flowing through the bus bar 11 with the sensor module 30 and outputs the detection signal. This allows for the elimination of the printed circuit board, which is one of the elements forming the prior art current sensor, and thereby improves the degree of design freedom for the current sensor. Further, each element is coupled with a higher reliability. Moreover, in comparison with the prior art current sensor that mounts the Hall element on the printed circuit board, due to the elimination of the printed circuit board, the current sensor of the first embodiment allows for size reduction and lower manufacturing costs.

(2) The case 1 is formed by the upper case 10, which integrates the detection portion of the bus bar 11 and the magnetic core 12, and the lower case 20, which integrates the metal pins T1 to T4. The coupling of the sensor module 30 to the metal pins T1 to T4 attaches the sensor module 30 to the lower case 20. Thus, the current sensor is completed just by coupling the upper and lower cases 10 and 20 to each other. This facilitates the assembling of the current sensor.

The sensor module is manufactured by mounting a magnetic detection element and electronic components on a lead frame and sealing the magnetic detection element, the electronic components, and the lead frame in a resin mold. This manufacturing process increases the reliability for coupling the elements and facilitates the manufacturing of the sensor module.

The first embodiment may be modified as described below.

Figure 7:
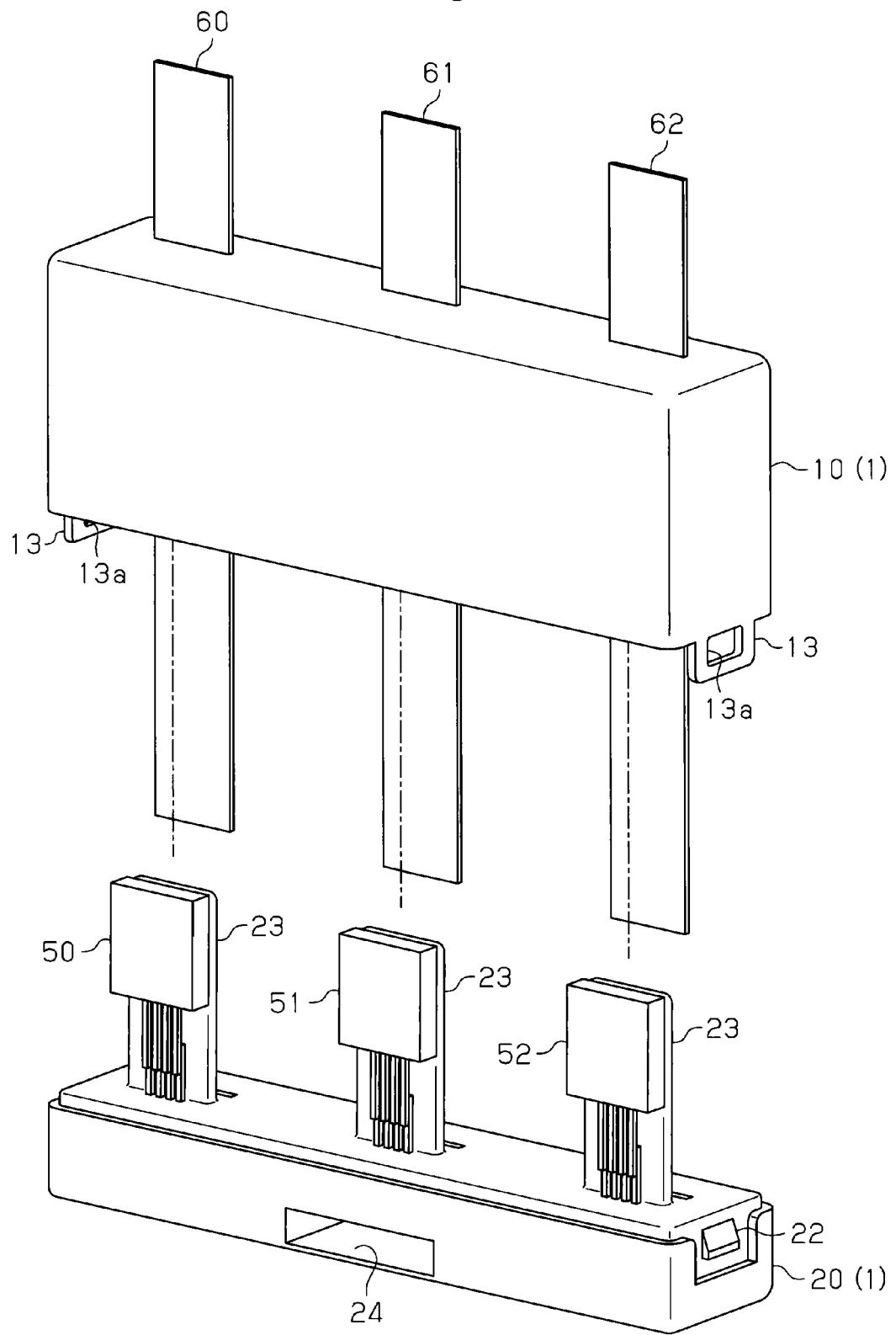
FIG. 7 is an exploded perspective view showing a second modification of the current sensor.
Figure 8:
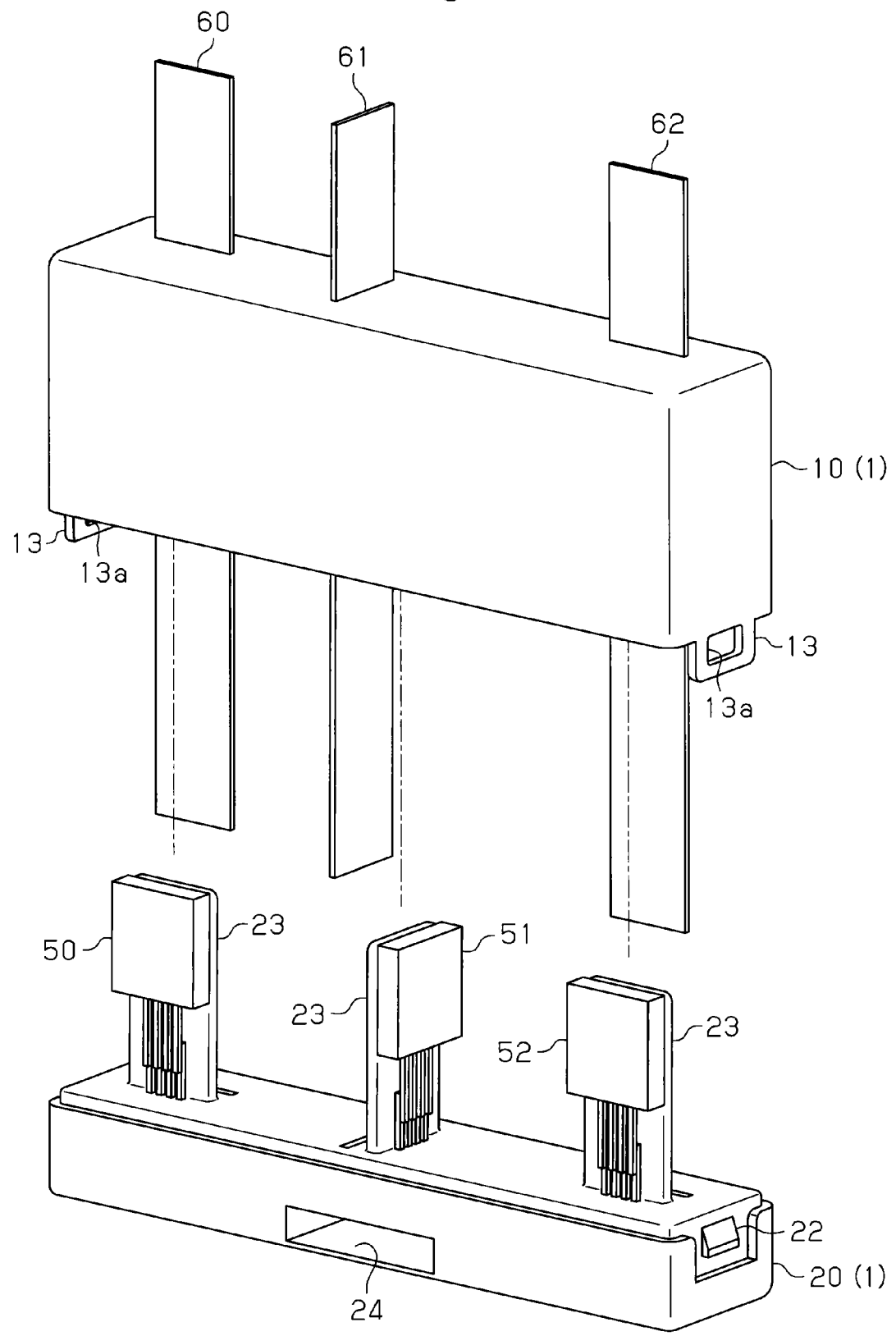
FIG. 8 is an exploded perspective view showing a third modification of the current sensor.

A hybrid vehicle generally includes an inverter that converts DC power, which is supplied from the vehicle battery, into three-phase AC power. The three-phase AC power converted by the inverter is supplied via three bus bars to each phase (U phase, V phase, and W phase) of an in-vehicle motor. In the hybrid vehicle, a current sensor normally detects the current flowing through the three bus bars and controls the power that the motor should be supplied with based on the detected current. Such a hybrid vehicle may use a current sensor that detects the current flowing through each of the three bus bars. This current sensor would have three sets of the magnetic core 12 and Hall IC 31. In such a current sensor, in comparison with a sensor that detects current flowing through only one bus bar, the shape and arrangement of the printed circuit board would impose great restrictions on the degree of design freedom. The structure of the current sensor illustrated in FIGS. 1 to 5 would thus be effective when employed in such a current sensor that detects the currents flowing through a plurality of bus bars. More specifically, a current sensor shown in FIG. 7 includes three sets of the structure illustrated in FIGS. 1 to 5. The current sensor includes three sensor modules 50, 51, and 52, which are arranged next to one another. The sensor modules 50, 51, and 52 respectively detect the currents flowing through bus bars 60, 61, and 62. The current sensor outputs detection signals corresponding to the detected currents. The sensor modules 50 to 52 are substantially the same as the sensor module 30 of FIGS. 1 to 5. A plurality of cores 12 are embedded in the upper case 10 in association with the bus bars 60 to 62. The lower case 20 includes a plurality of tongues 23 associated with the current sensor. Such a current sensor may easily cope with a design change requiring that the direction of one of the three sensor modules 50 to 52 (e.g., 51) be changed by "90°", as shown in FIG. 8. The current sensors of FIGS. 7 and 8 each output detection signals via a connector 24, which is connectable to a harness or the like (not shown).

Figure 9:
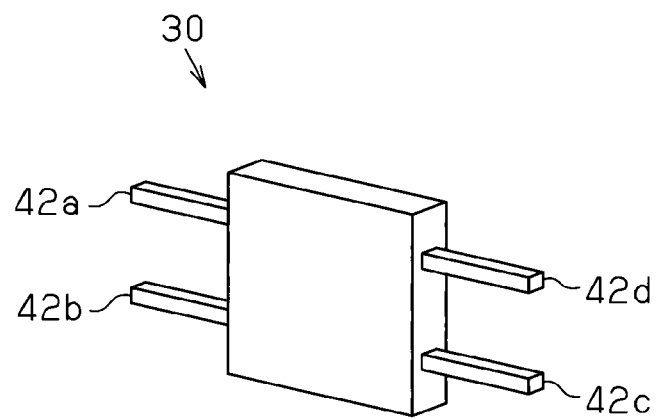
FIG. 9 is a perspective view showing a first modification of the sensor module.
Figure 10:
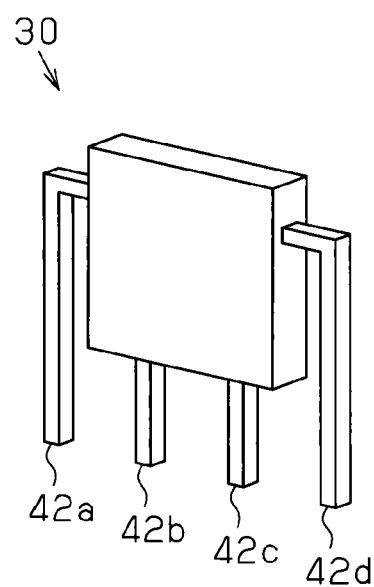
FIG. 10 is a perspective view showing a second modification of the sensor module.

In the first embodiment, the power supply and output terminals of the sensor module 30 are arranged on the bottom surface of the resin mold 33. However, the terminal layout is not limited in such a manner. For example, as shown in FIG. 9, in accordance with changes the size of the tongue 23 or changes in the layout of the metal pins T1 to T4, distal portions of the leads 42a to 42d may be extended out of two opposing side surfaces of the resin mold 33 for use as the power supply and output terminals of the sensor module 30. Alternatively, as shown in FIG. 10, distal portions of the leads 42a and 42b may be extended out in an L-shaped manner from the two side surfaces of the resin mold 33, distal portions of the leads 42b and 42c may be extended out of the bottom surface of the resin member, and the distal portions of the leads 42a to 42d may be used as the power supply and output terminals of the sensor module 30.

Figure 11:
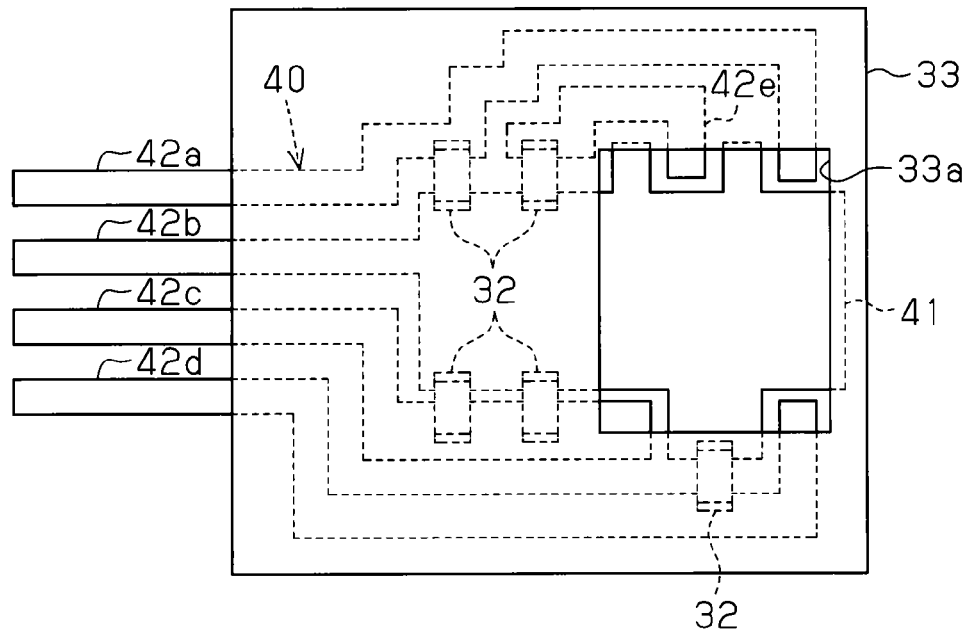
FIG. 11 is a plan view showing the sensor module before a Hall IC is mounted through an opening formed in a resin mold.
Figure 12:
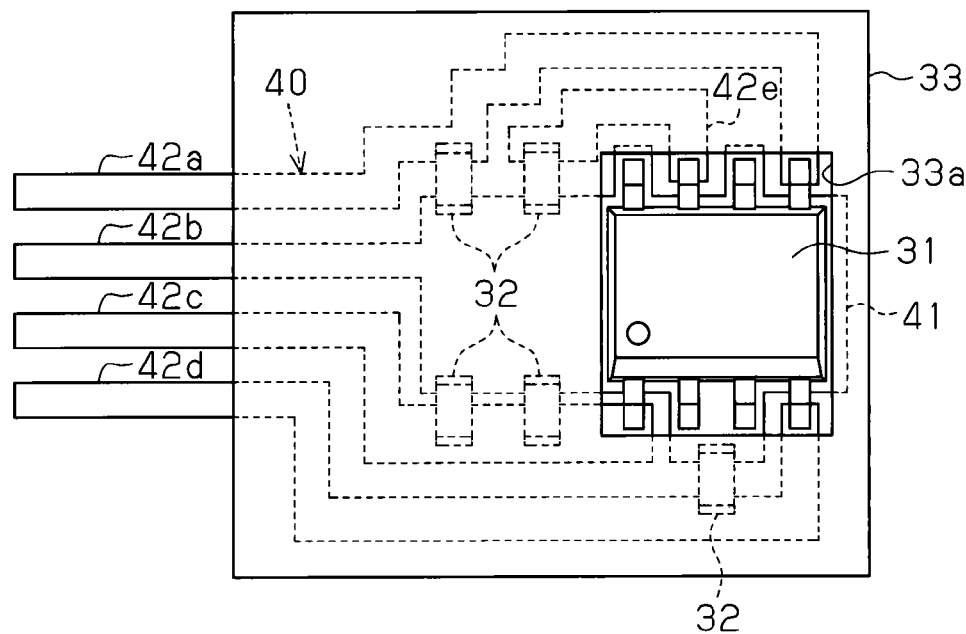
FIG. 12 is a plan view showing the sensor module after the Hall IC is mounted through the opening formed in the resin mold.

In the first embodiment, the Hall IC 31 and the electronic components 32 are mounted on the lead frame 40, which includes the element mounting portion 41 and the leads 42a to 42e. Then, these parts are sealed in a resin material when molding the resin mold 33 to manufacture the sensor module 30. FIGS. 11 and 12 show alternative examples for manufacturing the sensor module 30. In the alternative examples, the resin mold 33 is molded so that the electronic components 32 and the leads 42a to 42d are sealed integrally in the resin mold 33 and so that the element mounting portion 41 and the leads 42a to 42d are exposed through an opening 33a of the resin mold 33. Then, as shown in FIG. 12, the Hall IC 31 is mounted on the element mounting portion 41. Afterwards, the terminals of the Hall IC 31 and the basal portions of the leads 42a to 42e are coupled together through, for example, laser welding, to electrically connect the Hall IC 31 and the leads 42a to 42e. In the process for manufacturing the alternative examples, when mounting the Hall IC 31 on the element mounting portion 41, the walls defining the opening 33a guide the mounting of the Hall IC 31 onto the element mounting portion 41. Thus, the positioning of the Hall IC 31 on the element mounting portion 41 is performed with high accuracy.

In a further manufacturing process, for example, after mounting the Hall IC 31 and the electronic components 32 on the lead frame 40, the sensor module 30 may be molded with the Hall IC 31, the electronic components 32, and the lead frame 40 being accommodated in a suitable case.

Figure 13:
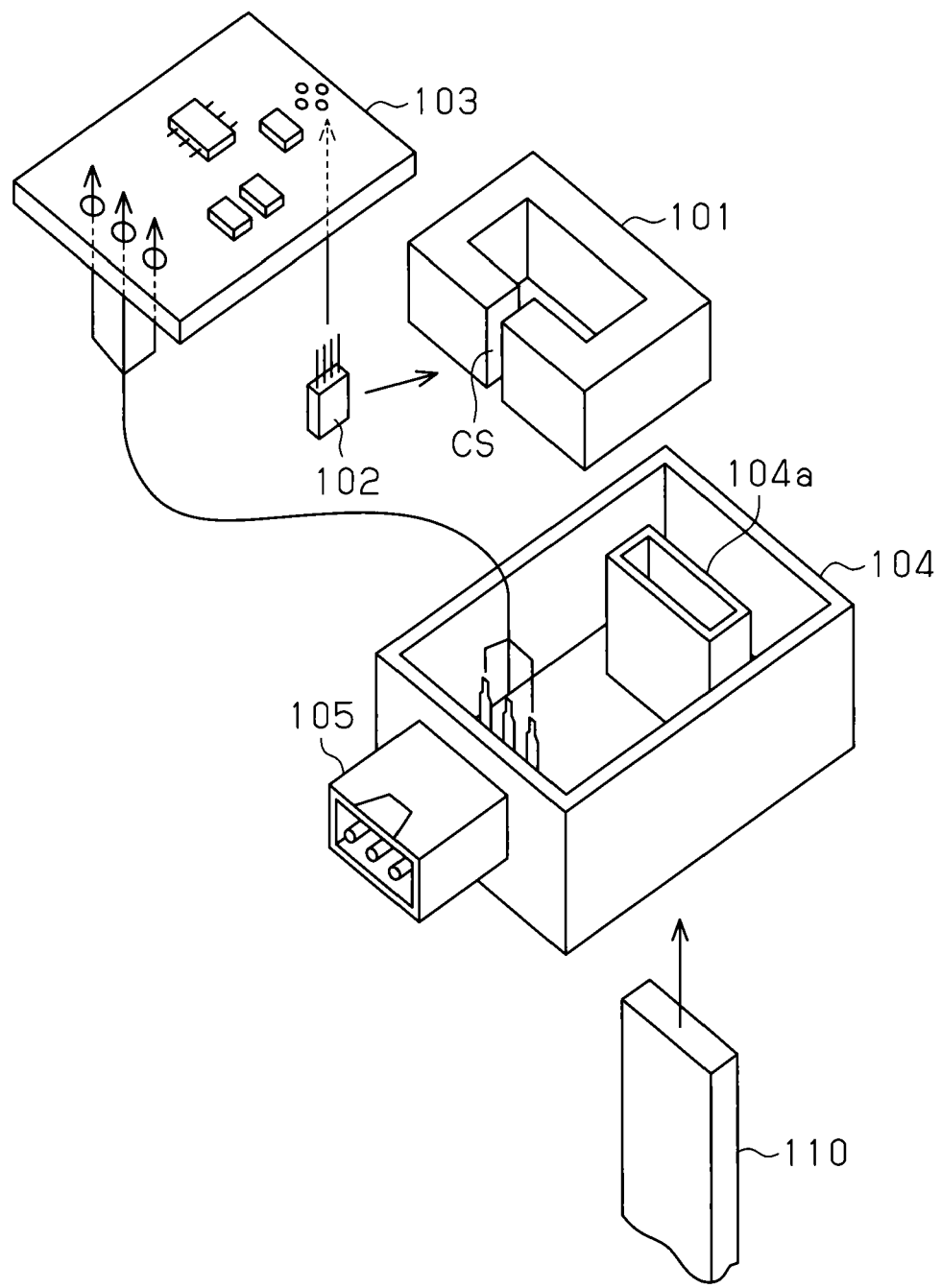
FIG. 13 is an exploded perspective view showing a current sensor of the prior art.

In the current sensor of the first embodiment, the detection portion of the bus bar 11 and the magnetic core 12 are integrally molded (embedded) with each other. Alternatively, the bus bar 11 and the magnetic core 12 may be discrete from each other. For example, the bus bar 11 may be separable from the case 1 (particularly, the upper case 10). For example, the sensor module 30 may be used in lieu of the Hall element 102 and the printed circuit board 103 of FIG. 13.

When the metal pins T1 to T4 have sufficient strength for supporting the sensor module 30, the tongue 23 may be eliminated. This simplifies the structure of the lower case 20 and consequently simplifies the structure of the current sensor.

In the first embodiment, the leakage flux generated in the clearance CT of the magnetic core 12 is detected by a Hall element. Instead, a magnetoresistance effect element of which resistance varies in accordance with the magnetic flux due to the magnetoresistance effect may be used to detect the leakage flux. As long as the magnetic flux concentrated by the magnetic core 12 is detected and an electrical signal corresponding to the detected magnetic flux is output, any magnetic detection element may be used.

It should be apparent to those skilled in the art that the present invention may be embodied in many other specific forms without departing from the scope of the invention. Therefore, the present examples and embodiments are to be considered as illustrative and not restrictive, and the invention is not to be limited to the details given herein, but may be modified within the scope and equivalence of the appended claims.

What is claimed is:

1. A current sensor for outputting a detection signal corresponding to a current flowing through a bus bar, the current sensor comprising:
    a magnetic core that concentrates and amplifies magnetic flux generated by the current near a detection portion of the bus bar;
    a magnetic detection element that detects the magnetic flux concentrated by the magnetic core and outputs an electrical signal corresponding to the detected magnetic flux;
    a signal processing circuit that includes electronic components and processes the electrical signal output from the magnetic detection element to generate the detection signal;
    a lead frame onto which the magnetic detection element and the electronic components of the signal processing circuit are mounted; and
    a first member that integrates the detection portion of the bus bar and the magnetic core;
    a second member that integrates a power supply terminal and an output terminal of the current sensor;
    wherein the magnetic detection element, the electronic components, and the lead frame are combined to form a single sensor module;
    the current sensor detects the current flowing through the bus bar with the sensor module and outputs the detection signal;
    the sensor module is coupled to the power supply terminal and the output terminal to attach the sensor module to the second member; and
    the first and second members are coupled to each other to form the current sensor.

2. The current sensor according to claim 1, wherein the bus bar is one of a plurality of bus bars;
    the magnetic core is one of a plurality of magnetic cores, wherein each magnetic core corresponds to at least one of the plurality of bus bars;
    the sensor module is one of a plurality of sensor modules, wherein each sensor module corresponds to at least one of the plurality of magnetic cores; and
    the current sensor detects the current flowing through each of the plurality of bus bars with the associated sensor modules.

3. The current sensor according to claim 2, further comprising:
    a first member that integrates the detection portions of the plurality of bus bars and the plurality of magnetic cores; and
    a second member that integrates a power supply terminal and an output terminal of the current sensor;
    wherein the plurality of sensor modules are coupled to the power supply terminal and the output terminal to attach the plurality of sensor modules to the second member; and
    the first and second members are coupled to each other to form the current sensor.

4. The current sensor according to claim 1, wherein the sensor module includes a resin mold that integrally seals the magnetic detection element, the electronic components, and the lead frame.

5. The current sensor according to claim 4, wherein the magnetic detection element and the electronic components are directly mounted onto the lead frame without a printed circuit board.

6. The current sensor according to claim 5, further comprising:
    a case including an accommodation compartment that accommodates the sensor module, wherein the detection portion of the bus bar and the magnetic core are embedded in
    the case, and the case is integrated with a connector that connects the current sensor to an external device.

7. The current sensor according to claim 6, wherein the case includes:
    a first segment;
    a second segment;
    a coupling structure that couples and integrates the first segment and the second segment;
    wherein the detection portion of the bus bar and the magnetic core are embedded in the first segment;
    the connector is formed integrally with the second segment; and
    the first segment and the second segment define the accommodation compartment when integrated.

8. The current sensor according to claim 7, wherein the connector includes a plurality of metal pins;
    the sensor module includes an output terminal and a power supply terminal coupled to the metal pins;

the sensor module is accommodated in the accommodation compartment in a state coupled to the metal pins of the connector; and the current sensor provides the detection signal output from the output terminal of the sensor module to the external device via the connector.

9. The current sensor according to claim 8, wherein the magnetic core is C-shaped and includes two opposing ends;

the magnetic core surrounds the detection portion of the bus bar;

the magnetic detection element is arranged in a clearance defined between the two opposing ends of the magnetic core; and the opposing ends each include a stepped surface.

10. A method for manufacturing the sensor module used in the current sensor according to claim 1, the method comprising:

mounting the electronic components onto the lead frame;

molding a resin mold so that the lead frame and the electronic components are sealed in the resin mold and so that an element mounting portion of the lead frame is exposed through an opening in the resin mold; and subsequently mounting the magnetic detection element on the element mounting portion through the opening to mold the sensor module.

11. A current sensor for detecting current and outputting a detection signal, the current sensor comprising:

a bus bar through which the current flows;

a magnetic core that concentrates and amplifies magnetic flux generated by the current near a detection portion of the bus bar;

a magnetic detection element that detects the magnetic flux concentrated by the magnetic core and outputs an electrical signal corresponding to the detected magnetic flux;

a signal processing circuit that includes electronic components and processes the electrical signal output from the magnetic detection element to generate the detection signal;

a lead frame onto which the magnetic detection element and the electronic components are directly mounted; and a case formed by a resin first member and a resin second member and including a connector;

wherein the magnetic detection element, the electronic components, and the lead frame are combined to form a single sensor module;

the detection portion of the bus bar and the magnetic core are embedded in the first member;

the sensor module is coupled to the second member;

when the first member and the second member are coupled to each other, the magnetic core and the magnetic detection element of the sensor module form a magnetic circuit surrounding the detection portion of the bus bar; and the current sensor detects the current flowing through the bus bar with the sensor module and outputs the detection signal from the connector.

12. A current sensor for outputting a detection signal corresponding to a current flowing through a plurality of bus bars, the current sensor comprising:

a plurality of magnetic cores, wherein each magnetic core concentrates and amplifies magnetic flux generated by the current near a detection portion of the bus bar, wherein each magnetic core corresponds to at least one of the plurality of bus bars;

a magnetic detection element that detects the magnetic flux concentrated by the magnetic core and outputs an electrical signal corresponding to the detected magnetic flux;

a signal processing circuit that includes electronic components and processes the electrical signal output from the magnetic detection element to generate the detection signal; and a lead frame onto which the magnetic detection element and the electronic components of the signal processing circuit are mounted;

wherein the magnetic detection element, the electronic components, and the lead frame are combined to form a plurality of single sensor module each corresponding to at least one of the plurality of bus bars such that each sensor detects the flow of current through the corresponding bus bars; and the current sensor detects the current flowing through the bus bar with the sensor module and outputs the detection signal.

13. A current sensor for detecting current and outputting a detection signal, the current sensor comprising:

a bus bar through which the current flows;

a magnetic core that concentrates and amplifies magnetic flux generated by the current near a detection portion of the bus bar, the magnetic core is C-shaped and includes two opposing ends defining a clearance, the two opposing ends each having an inner to outer thickness at said clearance that is greater than any inner to outer thickness of any other portion of the magnetic core;

the magnetic core surrounds the detection portion of the bus bar;

a magnetic detection element that detects the magnetic flux concentrated by the magnetic core and outputs an electrical signal corresponding to the detected magnetic flux, the magnetic detection element is arranged in the clearance defined between the two opposing ends of the magnetic core;

a signal processing circuit that includes electronic components and processes the electrical signal output from the magnetic detection element to generate the detection signal;

a lead frame onto which the magnetic detection element and the electronic components are directly mounted; and the current sensor detects the current flowing through the bus bar and outputs the detection signal.

14. The current sensor of claim 13 wherein the magnetic detection element, the electronic components, and the lead frame are combined to form a single sensor module.

15. A current sensor for detecting current and outputting a detection signal, the current sensor comprising:

a bus bar through which the current flows;

a magnetic core that concentrates and amplifies magnetic flux generated by the current near a detection portion of the bus bar, the magnetic core is C-shaped and includes two opposing ends defining a clearance, the clearance narrows from an inner side of the magnetic core toward an outer side of the magnetic core;

the magnetic core surrounds the detection portion of the bus bar;

a magnetic detection element that detects the magnetic flux concentrated by the magnetic core and outputs an electrical signal corresponding to the detected magnetic flux, the magnetic detection element is arranged in the clearance defined between the two opposing ends of the magnetic core;

a signal processing circuit that includes electronic components and processes the electrical signal output from the magnetic detection element to generate the detection signal;

a lead frame onto which the magnetic detection element and the electronic components are directly mounted; and the current sensor detects the current flowing through the bus bar and outputs the detection signal.

16. The current sensor of claim 15 wherein the magnetic detection element, the electronic components, and the lead frame are combined to form a single sensor module.

* * * * *